(12) United States Patent
Song et al.

(10) Patent No.: US 10,014,470 B2
(45) Date of Patent: Jul. 3, 2018

(54) ORGANIC LIGHT EMITTING DIODE SUBSTRATE AND METHOD FOR MANUFACTURING THE SAME

(71) Applicant: BOE Technology Group Co., Ltd., Beijing (CN)

(72) Inventors: Yingying Song, Beijing (CN); Li Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/512,121

(22) PCT Filed: Apr. 14, 2016

(86) PCT No.: PCT/CN2016/079263
§ 371 (c)(1),
(2) Date: Mar. 17, 2017

(87) PCT Pub. No.: WO2016/188259
PCT Pub. Date: Dec. 1, 2016

(65) Prior Publication Data
US 2017/0279047 A1    Sep. 28, 2017

(30) Foreign Application Priority Data

May 26, 2015  (CN) .......................... 2015 1 0275095

(51) Int. Cl.
*H01L 51/00* (2006.01)
*H01L 29/786* (2006.01)
(Continued)

(52) U.S. Cl.
CPC .......... *H01L 51/0002* (2013.01); *H01L 29/66* (2013.01); *H01L 29/78645* (2013.01);
(Continued)

(58) Field of Classification Search
CPC ............ H01L 51/0545; H01L 51/0036; H01L 51/0541; H01L 51/5012
See application file for complete search history.

(56) References Cited

U.S. PATENT DOCUMENTS 7,091,660 B2    8/2006  Park et al.
7,638,358 B2 *  12/2009  Oh ....................... H01L 51/0545
                                                       438/151
(Continued)

FOREIGN PATENT DOCUMENTS

CN    1518140       8/2004
CN    1873999       12/2006
(Continued)

OTHER PUBLICATIONS

Office Action from Chinese Patent Application No. 201510275095. 2, dated Jun. 28, 2017.
(Continued)

*Primary Examiner* — Quoc Hoang
(74) *Attorney, Agent, or Firm* — Westman, Champlin & Koehler, P.A.

(57) ABSTRACT

The present disclosure discloses an organic light emitting diode substrate and a method for manufacturing the same. In one embodiment the present disclosure, an organic light emitting diode substrate includes a display region in which an organic film layer that is formed by curing an ink layer is provided, and a border region located outside the display region and including an exposed area in which no organic film layer is provided. The organic light emitting diode substrate further includes: a barrier structure located in the border region and adapted for preventing the ink layer from coming into contact with a surface of the exposed area.

13 Claims, 2 Drawing Sheets

(51) Int. Cl.
*H01L 29/66* (2006.01)
*H01L 27/32* (2006.01)

(52) U.S. Cl.
CPC ........ *H01L 27/326* (2013.01); *H01L 51/0005* (2013.01); *H01L 2251/5307* (2013.01)

(56) References Cited

U.S. PATENT DOCUMENTS

| | | | |
|---|---|---|---|
| 8,304,989 B2* | 11/2012 | Song | H01L 51/5246 |
| | | | 313/506 |
| 8,432,528 B2 | 4/2013 | Nara et al. | |
| 9,412,946 B2 | 8/2016 | Chen et al. | |
| 2011/0175522 A1 | 7/2011 | Goda | |
| 2014/0206119 A1 | 7/2014 | Kang | |

FOREIGN PATENT DOCUMENTS

| | | |
|---|---|---|
| CN | 10179561 | 8/2010 |
| CN | 103367249 A | 10/2013 |
| CN | 104992958 A | 10/2015 |
| WO | WO 2010/035643 | 4/2010 |

OTHER PUBLICATIONS

International Search Report (English translation) and Written Opinion of International Application No. PCT/CN2016/079263, dated Jul. 19, 2016, 6 pages.

English translation of Box No. V of the Written Opinion for the International Searching Authority for International Application No. PCT/CN2016/079263, 1 page.

English translation of International Search Report and Written Opinion for International Application No. PCT/CN2016/079263, dated Jul. 19, 2016, 6 pages.

* cited by examiner

ORGANIC LIGHT EMITTING DIODE SUBSTRATE AND METHOD FOR MANUFACTURING THE SAME

CROSS-REFERENCE TO RELATED APPLICATION

The present application is the U.S. national phase entry of PCT/CN2016/079263, with an international filing date of Apr. 14, 2016, which claims the benefit of Chinese Patent Application No. 201510275095.2, filed on May 26, 2015, the entire disclosures of which are incorporated herein by reference.

TECHNICAL FIELD

The present disclosure relates to the field of organic light emitting diode manufacturing technology, and particularly to an organic light emitting diode substrate and a method for manufacturing the same.

BACKGROUND

Organic Light Emitting Diode (OLED) display apparatus mainly depends on luminescence of organic light emitting diode. Organic light emitting diode comprises a cathode, an anode and a plurality of organic film layers sandwiched therebetween. The organic film layer is mainly manufactured by evaporation process or solution process. The evaporation process encounters many drawbacks in manufacturing of large-sized organic light emitting diode substrate, for example, the mask is easy to offset or deform under high temperature, and the like. As to the solution process, an ink layer of organic material is formed on a base plate by ways of ink jet printing, spin coating, etc., and the ink layer is cured to form a corresponding organic film layer, which is more suitable for manufacturing of large-sized organic light emitting diode substrate.

SUMMARY

According to one aspect of the present disclosure, there is provided an organic light emitting diode substrate, comprising: a display region in which an organic film layer that is formed by curing an ink layer is provided, and a border region located outside the display region and comprising an exposed area in which no organic film layer is provided, wherein, the organic light emitting diode substrate further comprises:

a barrier structure located in the border region and adapted for preventing the ink layer and/or the organic film layer from coming into contact with a surface of the exposed area.

In an embodiment of the present disclosure, a first conductive layer is provided within the exposed area; the barrier structure is located above the first conductive layer; and a second conductive layer is further provided within the exposed area and is located above the barrier structure, the first conductive layer within the exposed area being at least partially in contact with the second conductive layer.

In an embodiment of the present disclosure, the ink layer is formed by using an inkjet printing process; and, the barrier structure comprises a plurality of protrusions spaced apart within the exposed area, with a spacing between upper ends of adjacent said protrusions being between 8 microns and 20 microns.

In an embodiment of the present disclosure, the protrusion is made of a material that is lyophobic relative to the ink layer.

In an embodiment of the present disclosure, the protrusion is in a strip shape, a length direction of the protrusion is perpendicular to a printing direction of the ink layer.

In an embodiment of the present disclosure, the organic light emitting diode substrate further comprises: an organic light emitting diode provided within the display region and comprising an anode, an organic film layer and a cathode; wherein, the exposed area comprises a cathode contacting area; the first conductive layer is provided within the cathode contacting area, a surface of the first conductive layer is formed with a plurality of recesses, and, the first conductive layer is located in the same layer as but is spaced apart from the anode; and, the cathode is located in the same layer as and is connected to the second conductive layer.

In an embodiment of the present disclosure, the protrusion is in a strip shape, and a length direction of the protrusion is perpendicular to a printing direction of the ink layer; and, the recess is in a strip shape and is parallel to the protrusion.

In an embodiment of the present disclosure, the protrusion is provided at a position outside the recess.

In an embodiment of the present disclosure, the ink layer is formed by using a spin coating process; and, the barrier structure comprises a retaining wall provided outside a side of the exposed area close to the display region.

In an embodiment of the present disclosure, the barrier structure further comprises: retaining walls provided outside two lateral sides of the exposed area adjoining the side of the exposed area close to the display region.

In an embodiment of the present disclosure, the retaining wall has a height of 0.5 um~2.0 um.

In an embodiment of the present disclosure, the organic light emitting diode substrate further comprises: an organic light emitting diode provided within the display region and comprising an anode, an organic film layer and a cathode; wherein, the exposed area comprises a cathode contacting area provided therein with a first conductive layer and a second conductive layer provided above the first conductive layer; the first conductive layer provided within the cathode contacting area is located in the same layer as but is spaced apart from the anode, and, a surface of the first conductive layer is formed with a plurality of recesses; and the second conductive layer within the cathode contacting area is located in the same layer as and is connected to the cathode.

In an embodiment of the present disclosure, the organic light emitting diode substrate further comprises: a pixel defining layer which is located in the same layer as the barrier structure.

According to another aspect of the present disclosure, there is provided a method for manufacturing the above-mentioned organic light emitting diode substrate, and the method comprises:

forming the barrier structure; and forming the ink layer so that the ink layer does not come into contact with the surface of the exposed area within the border region of the organic light emitting diode substrate.

DETAILED DESCRIPTION OF THE EMBODIMENTS

Figure 1:
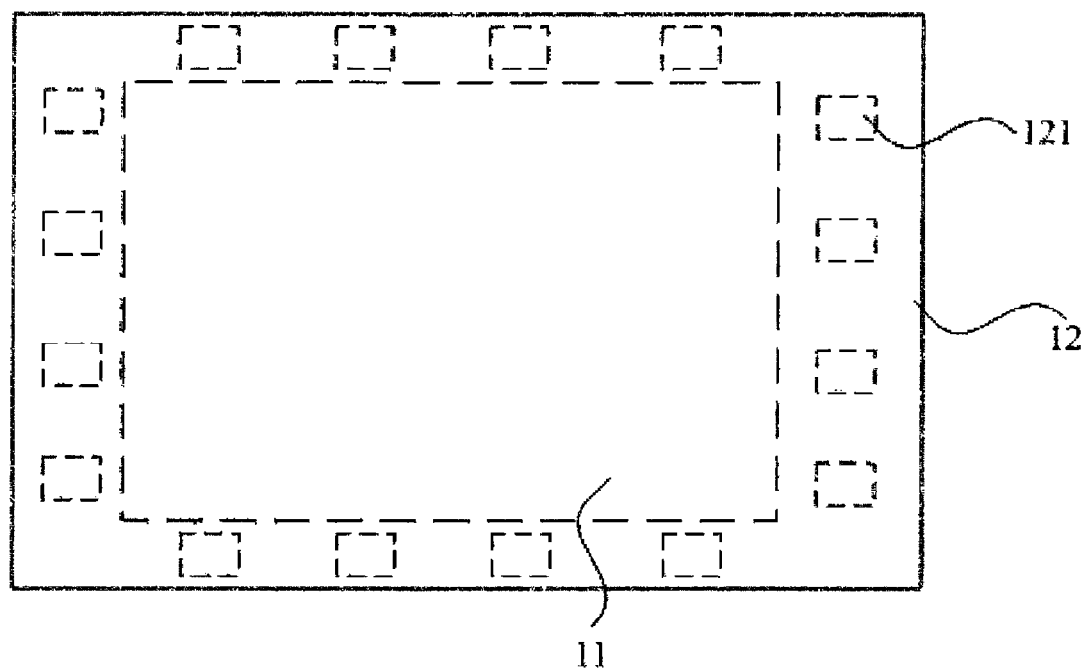
FIG. 1 is a structural schematic view of an organic light emitting diode substrate according to an embodiment of the present disclosure in top view.

In order to provide a better understanding of technique solutions of the present disclosure, the present disclosure will be further described hereinafter in detail in conjunction with embodiments and with reference to the attached drawings.

First Embodiment

Referring to FIG. 1 to FIG. 6, the present embodiment provides an organic light emitting diode substrate. The organic light emitting diode substrate comprises: a display region 11 and a border region 12 located outside the display region 11. An organic film layer 4 that is formed by curing an ink layer is provided within the display region 11, and the border region 12 comprises an exposed area in which no organic film layer 4 is provided.

That is to say, the organic light emitting diode substrate comprises the display region 11 for display purpose. A plurality of organic light emitting diodes are provided within the display region 11, and each of the organic light emitting diodes comprises a cathode, an anode and a plurality of organic film layers 4 sandwiched between the cathode and the anode. These organic film layers 4 are manufactured by solution process. That is, an ink layer of organic material is formed on the base plate 9, and then the ink layer is dried and cured to form the organic film layer 4. In the organic light emitting diode substrate, the border region 12 is further provided outside the display region 11. The border region 12 is for connections to driving chip or serving as a frame of the display apparatus. Within the border region 12, there are one or more exposed areas where no organic film layer 4 is presented, for various electrical connections. Of course, it is also feasible that no organic film layer 4 is presented within the whole border region 12.

The organic light emitting diode substrate further comprises a barrier structure located below the organic film layer 4 and adapted for preventing the ink layer and/or the organic film layer from coming into contact with a surface of the exposed area.

Here, the "layer(s)" mentioned in this disclosure indicates, all the constituents of the organic light emitting diode substrate are formed of certain material layers, accordingly, sequence of formations of these material layers is also sequence of superpositions of these constituents. For example, "an A constituent is located below a layer where a B constituent is (or a B constituent is located above a layer where an A constituent is)" indicates that a material layer for the A constituent is manufactured firstly and then a material layer for the B constituent is manufactured, but neither indicates that the A constituent is necessarily under the B constituent nor indicates that the A constituent is just under the B constituent. For similar reasons, "An A constituent is located/disposed in the same layer as a B constituent" indicates that the two constituents are made of same material layer, but not indicates that distances between the two and the base plate 9 are the same. For example, in the embodiment shown in FIG. 3, the organic light emitting diode substrate mainly also comprises a base plate 9, a source-drain layer 6, a passivation layer 2, an indium tin oxide layer 3, etc.

The organic light emitting diode substrate according to the present embodiment has the barrier structure which is able to prevent the ink layer and/or the organic film layer from coming into contact with the surface of the exposed area. Accordingly, the barrier structure is necessarily under the organic film layer 4 that is formed by curing the ink layer (namely, the barrier structure is formed firstly, and then the organic film layer 4 is formed from the ink layer). Due to provision of the barrier structure, the ink layer will not come into contact with the surface of the exposed area, accordingly, no organic film layer 4 will be formed on the surface of the exposed area after the ink layer is cured. As a result, the organic film layer 4 can be removed easily, avoiding damage to other constituents in a cleaning process, as well as avoiding residual of the organic film layer 4 within the exposed area, thereby improving quality of the product.

In an embodiment of the present disclosure, a first conductive layer is provided within the exposed area; the barrier structure is located above the first conductive layer; and, a second conductive layer is further provided within the exposed area and is located above the first conductive layer, the first conductive layer within the exposed area being at least partially in contact with the second conductive layer.

That is to say, within the exposed area there may include two conductive layers being at least partially adjacent to each other in an up-down direction. The organic film layer 4 will be formed after formation of the first conductive layer but prior to formation of the second conductive layer. Accordingly, the factor that the organic film layer 4 is not removed completely will adversely affect connection between the two conductive layers. Thus, this configuration is provided with the abovementioned barrier structure, to prevent the ink layer from coming into contact with the surface of the exposed area, thereby avoiding residual of the organic film layer 4 within the exposed area in final configuration. Of course, in order to avoid the ink layer from coming into contact with the first conductive layer, the first conductive layer, the barrier structure, the organic material layer and the second conductive layer should be provided in sequence in a direction that is started from the base plate 9, during manufacturing of the organic light emitting diode substrate.

In an embodiment of the present disclosure, the abovementioned exposed area comprises a cathode contacting area 121. The first conductive layer within the cathode contacting area 121 is disposed in the same layer as but is spaced apart from an anode of the organic light emitting diode. The surface of the first conductive layer is provided with a plurality of recesses 8, and, the second conductive layer is disposed in the same layer as and is connected to a cathode of the organic light emitting diode.

That is to say, an example of the exposed area can be the abovementioned cathode contacting area 121. Specifically, the first conductive layer within the cathode contacting area 121 is disposed in the same layer as but is spaced apart from the anode of the organic light emitting diode. And, the first conductive layer may be an indium tin oxide layer 3 (which will be taken as an example hereinafter). The indium tin oxide layer 3 may be disposed above the passivation layer 2 that is formed with lots of connection holes, through which the indium tin oxide layer 3 is connected with the source-drain layer 6 disposed below the passivation layer 2 and connected to the driving circuit. Obviously, a surface of the indium tin oxide layer 3 at positions corresponding to the connection holes are formed with recesses 8, which bring difficulty to removal of the organic film layer 4. Here, the reason for provision of the recesses 8 (connection holes) other than removal of the whole passivation layer 3 within the cathode contacting area 121 is mainly because considerations on technology aspect and reliability aspect are taken.

The barrier structure is disposed above the indium tin oxide layer 3 (for example, directly on the indium tin oxide layer 3) while the organic film layer 4 is disposed above the barrier structure. As a result, during formation of the ink layer, the barrier structure can prevent the ink layer and/or the organic film layer from coming into contact with the indium tin oxide layer 3 within the cathode contacting area 121, thereby ensuring that no organic film layer 4 is formed on the surface of the indium tin oxide layer 3 within the cathode contacting area 121.

Disposed above the organic film layer 4 is the second conductive layer. The second conductive layer is located in the same layer as and is connected to cathode of the organic light emitting diode, and the second conductive layer may be a metal layer 5 (which will be taken as an example hereinafter) of metal such as aluminium and the like. The metal layer 5 is also connected to the indium tin oxide layer 3 within the cathode contacting area 121 (since no organic film layer 4 is within the cathode contacting area 121), accordingly, the driving signal is firstly transmitted to the source-drain layer 6, and then to the indium tin oxide layer 3 through the connection holes, and then to the metal layer 5, and finally to cathodes of these organic light emitting diodes, thereby providing the signal to these cathodes in order for driving of the cathodes.

In an embodiment of the present disclosure, the above-mentioned ink layer is formed by using an inkjet printing process. Here, the barrier structure comprises a plurality of protrusions 71 spaced apart within the cathode contacting area 121, with a spacing between upper ends of adjacent protrusions 71 being 8~20 microns. In an embodiment of the present disclosure, the abovementioned protrusion 71 may be made of lyophobic material relative to the ink layer.

Figure 2:
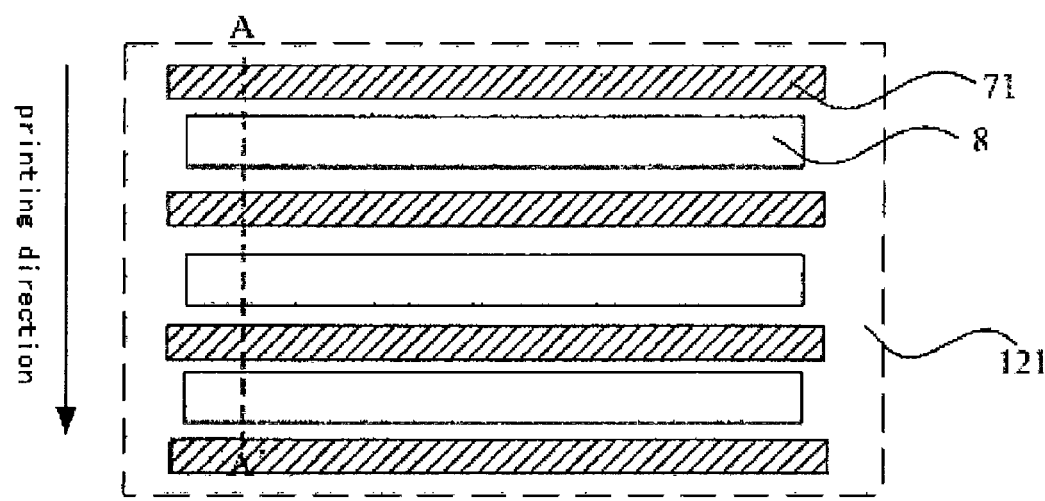
FIG. 2 is a partial structural schematic view of a cathode contacting area of the organic light emitting diode substrate according to an embodiment of the present disclosure in top view.
Figure 3:
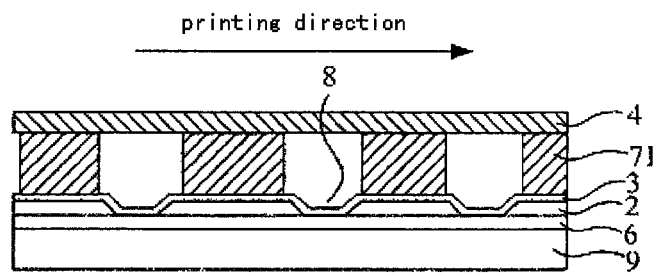
FIG. 3 is a structural schematic view of the cathode contacting area, after forming an organic film layer, in cross-sectional view taken along line AA' in FIG. 2.
Figure 4:
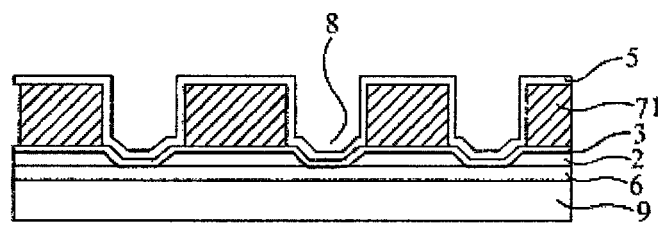
FIG. 4 is a structural schematic view of the cathode contacting area, after forming a metal layer, in cross-sectional view taken along line AA' in FIG. 2.

That is to say, referring to FIG. 2 to FIG. 4, the ink layer can be formed by using an inkjet printing process (for example, a continuous inkjet printing process), namely, a plurality of inkjet heads arranged in one row are operated synchronously to inject the ink together, so as to form an ink layer.

In case that the ink layer is formed by using an inkjet printing process, the barrier structure comprises a plurality of protrusions 71 disposed within the cathode contacting area 121, with certain spacings between upper ends of these protrusions 71, here, the other parts are not limited. Referring to FIG. 3 and FIG. 4, once ink is injected onto the protrusions 71, the ink will be kept above these protrusions 71 but won't flow downwards through the spacings between these protrusions 71 as the spacings are small and the protrusions 71 own lyophobic performance. As a result, when the ink layer is cured into the organic film layer 4, this organic film layer 4 is also disposed above the protrusions 71, thus the formed organic film layer 4 will not come into contact with the recesses 8 directly. As a result, the organic film layer 4 can be removed easily. Or, the ink layer above the protrusions 71 can also be removed by wiping before the ink is cured. In a word, in this case, the organic film layer 4 (or the ink layer) can be removed more easily, so, it will not bring any damage to other constituents during removal of the organic film layer 4 and there is no residual of the organic film layer 4 within the cathode contacting area 121, thereby improving quality of the product.

In an embodiment of the present disclosure, the protrusion 71 may be made of lyophobic material, namely, when the ink is contacting the protrusions 71, the ink is prone to condense into drops other than wetting. As a result, the ink is not prone to flow downwards through the spacings between these protrusions 71. For example, the protrusions 71 can be made of organic fluorine compound.

In an embodiment of the present disclosure, the protrusion 71 is provided at a position outside the recess 8.

As mentioned above, lots of recesses 8 are formed within the cathode contacting area 121, while the protrusions 71 should be provided in flat positions where there is no recess 8. This ensures that upper ends of these protrusions 71 are placed in the same plane so that the organic film layer 4 formed thereon is also flat and thus is easy to be removed.

In an embodiment of the present disclosure, the protrusion 71 is in a strip shape, and a length direction of the protrusion 71 is perpendicular to a printing direction of the ink layer.

In an embodiment of the present disclosure, there is no limitation on shapes of the protrusions 71 so long as it is ensured that the spacing between upper ends of adjacent protrusions 71 meets the above requirements. For example, the protrusions 71 may be a plurality of independent pieces. In view of simplifying the process, the protrusions 71 should not be too small. Referring to FIG. 2, the protrusions 71 are in strip shapes (here, distances between these strips are defined as the abovementioned spacings between upper ends of adjacent protrusions 71), which are perpendicular to the printing direction (namely an advancing direction of the print head). Such protrusions 71 not only are simple in configuration but also achieve improved effect of blocking the ink layer.

In an embodiment of the present disclosure, the recess 8 is in a strip shape, and a length direction of the recess 8 is parallel to the length direction of the protrusion 71.

Figure 6:
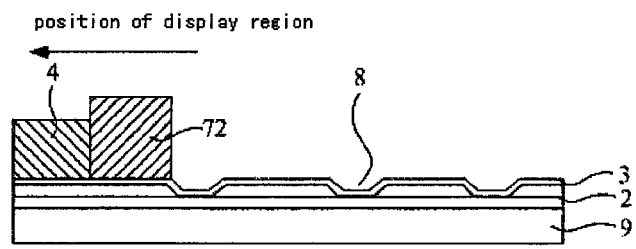
FIG. 6 is a structural schematic view of the cathode contacting area, after forming an organic film layer, in cross-sectional view taken along line AA' in FIG. 5.

In conventional cathode contacting area 121, the recess 8 is resulted from the connection hole formed in the passivation layer 2 and thus is a small piece. Referring to FIG. 6, in this embodiment, the recess 8 is in a strip structure that is parallel to the protrusion 71 (and, correspondingly, the connection hole in the passivation layer 2 becomes a connection groove). In this way, the organic film layer 4 within the exposed area can be removed in an improved manner.

Of course, according to abovementioned way, the barrier structure (protrusions 71) is disposed within the cathode contacting area 121, thus, in the finally formed configuration, the protrusions 71 are sandwiched between the indium tin oxide layer 3 and the metal layer 5. Of course, referring to FIG. 4, because the protrusions 71 are spaced apart from one another, the indium tin oxide layer 3 is in contact with the metal layer 5 at positions where no protrusions 71 are provided.

In an embodiment of the present disclosure, the ink layer is formed by using a spin coating process, and the barrier structure comprises a retaining wall 72 provided outside a side of the exposed area (here, the cathode contacting area 121 will be taken as an example of the exposed area hereinafter) close to the display region 11.

Figure 5:
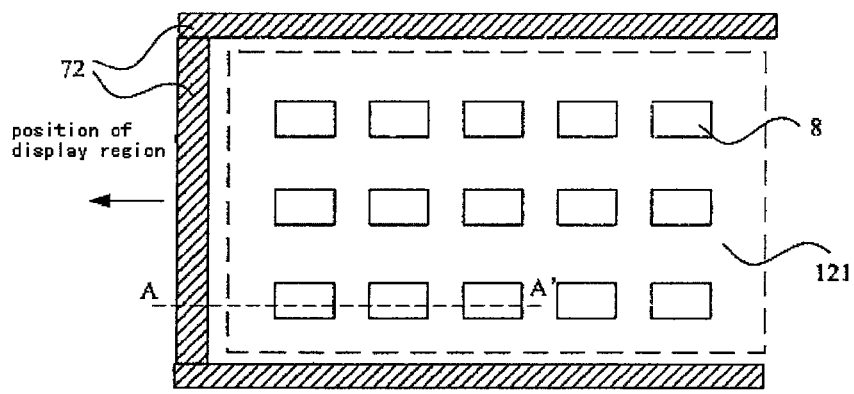
FIG. 5 is a partial structural schematic view of a cathode contacting area of an organic light emitting diode substrate according to another embodiment of the present disclosure in top view.

Referring to FIG. 5 and FIG. 6, the ink layer may also be formed by using a spin coating process. Here, the barrier structure comprises a retaining wall 72 provided at least outside a side of the cathode contacting area 121 close to the display region 11 (left side in FIG. 5). The spin coating process is also named as an adhesive evening method, specifically, firstly ink is applied onto a middle of the display region 11 of the organic light emitting diode substrate, and then the organic light emitting diode substrate is spun so that the ink is dispersed into an ink layer under the action of the centrifugal force. To this end, as long as a retaining wall 72 is provided outside a side of the cathode contacting area 121 close to the display region 11, the ink is prevented from passing through and entering the exposed area (namely, the cathode contacting area 121 in this embodiment), thereby preventing the ink layer from coming into contact with the surface of the cathode contacting area 121.

In an embodiment of the present disclosure, the barrier structure may further comprise: retaining walls 72 provided outside two lateral sides of the exposed area adjoining the side of the cathode contacting area 121 close to the display region 11.

That is to say, referring to FIG. 5, besides that the retaining wall 72 is provided outside the side (left side in FIG. 5) of the cathode contacting area 121 close to the display region 11, the retaining walls 72 are also provided outside the two lateral sides (upper and lower sides in FIG. 5) of the exposed area adjoining this side of the cathode contacting area 121 close to the display region 11, so as to prevent the ink from entering the cathode contacting area 121 from the two lateral sides.

In an embodiment of the present disclosure, the abovementioned retaining wall 72 has a height of 0.5 µm~2.0 µm, and more preferably of 0.8 µm~1.3 µm.

In an embodiment of the present disclosure, the ink cannot be blocked if the height of the retaining wall 72 is too small, while other issues will be caused if the height of the retaining wall 72 is too great. Accordingly, the abovementioned range of height of the retaining wall 72 can be chosen.

In an embodiment of the present disclosure, the organic light emitting diode substrate further comprises a pixel defining layer (PDL) which is located in the same layer as the barrier structure.

The pixel defining layer is a known part of the organic light emitting diode substrate and is disposed between these pixels (sub-pixels) in order to division of these pixels. The pixel defining layer is normally located between the cathode and the organic film layer 4, that is, it is the location where the barrier structure is. Accordingly, the pixel defining layer and the barrier structure may be formed by using one material layer, so that no additional step is required to be added to manufacture the barrier structure, and there is no change in conventional manufacturing process, thereby, the method of manufacturing organic light emitting diode substrate according to the present disclosure can be simplified.

In an embodiment of the present disclosure, the present embodiment also provides a method for manufacturing the abovementioned organic light emitting diode substrate. The method comprises:

forming the barrier structure; and forming the ink layer so that the ink layer does not come into contact with the surface of the exposed area within the border region of the organic light emitting diode substrate.

That is to say, prior to formation of the ink layer, the abovementioned barrier structure may be formed in advance. As a result, when forming the ink layer, the ink layer does not come into contact with the surface of the exposed area (namely, the ink layer will be formed on the barrier structure, or it won't enter the exposed area at all). In this way, the organic film layer 4 that is formed by curing the ink layer does not come into contact with the surface of the exposed area, either. Accordingly, the organic film layer can be removed easily in subsequent process (or, the ink layer may be directly removed before being cured), thereby avoiding any damage to other constituents or avoiding residual of the organic film layer 4 within the exposed area.

The barrier structure may be formed in a routine patterning process, or may be formed synchronously with the pixel defining layer within the display region 11. The patterning process normally includes one or more of steps including formation of a material layer, photoresist coating, exposure, developing, etching, photoresist stripping, etc.

The ink layer may be formed by using abovementioned inkjet printing process or spin coating process. Based on the above description of the present disclosure, suitable barrier structure will be selected according to different formation methods of the ink layer. After being formed, the ink layer may be cured into the organic film layer 4 by means of drying it by heating or by burning-off.

Routine methods including plasma etching, laser cleaning, wiping and the like may be adopted for removal of the organic film layer 4, here, at least the organic film layer 4 (or the ink layer) within the exposed area should be removed. Normally, all the organic film layer 4 (or the ink layer) within the border region 12 are removed.

After implementing removal of the organic film layer 4, steps of forming other known constituents such as the second conductive layer (cathode) and the like are implemented. In the process of manufacturing the organic light emitting diode substrate, although only the step of forming the barrier structure and the step of forming the ink are mainly described in this embodiment of the abovementioned method for manufacturing an organic light emitting diode substrate, many other known steps may also be included, for example, step of forming the passivation layer 2, step of forming connection holes in the passivation layer 2, step of forming thin-film transistor (source, drain, gate, gate insulation layer, active region), step of forming leading wires (gate line, data line), step of forming anode, and the like. These other steps of manufacturing the organic light emitting diode substrate are not described in details herein as they are known.

It should be understood that, the embodiment where the cathode contacting area 121 serves as an example of the exposed area is presented to illustrate the present invention, however, the exposed area may also be other area within the border region. Meanwhile, the embodiment where the indium tin oxide layer 3 and the metal layer 5 serve as an example of the first and second conductive layers is presented to illustrate the present invention, however, the two conductive layers may be of other materials.

Second Embodiment

In this embodiment, there provides a display apparatus comprising any of the abovementioned organic light emitting diode substrates.

Specifically, the display apparatus can be any products or components having a display function, for example, electronic paper, OLED panel, mobile phone, tablet computer, TV, display, notebook computer, digital photo frame, navigating instrument, etc.

It should be understood that the abovementioned embodiments are merely exemplary and are used to illustrate principle of the present invention, but not to limit the present disclosure. Various changes and modifications made within principles and spirit of the present invention should be included within the scope of the present disclosure.

What is claimed is:

1. An organic light emitting diode substrate, comprising: a display region in which an organic film layer that is formed by curing an ink layer is provided, and a border region located outside the display region and comprising an exposed area in which no organic film layer is provided, wherein, the organic light emitting diode substrate further comprises:
    a barrier structure located in the border region and adapted for preventing the ink layer and/or the organic film layer from coming into contact with a surface of the exposed area; and
    a pixel defining layer which is located in the same layer as the barrier structure.

2. The organic light emitting diode substrate of claim 1, wherein,
    a first conductive layer is provided within the exposed area;
    the barrier structure is located above the first conductive layer; and
    a second conductive layer is further provided within the exposed area and is located above the barrier structure, the first conductive layer within the exposed area being at least partially in contact with the second conductive layer.

3. The organic light emitting diode substrate of claim 2, wherein,
    the ink layer is formed by using an inkjet printing process; and
    the barrier structure comprises a plurality of protrusions spaced apart within the exposed area, with a spacing between upper ends of adjacent said protrusions being between 8 microns and 20 microns.

4. The organic light emitting diode substrate of claim 3, wherein,
    the protrusion is made of a material that is lyophobic relative to the ink layer.

5. The organic light emitting diode substrate of claim 4, wherein,
    the protrusion is in a strip shape, and a length direction of the protrusion is perpendicular to a printing direction of the ink layer.

6. The organic light emitting diode substrate of claim 2, further comprising: an organic light emitting diode provided within the display region and comprising an anode, the organic film layer and a cathode; wherein,
    the exposed area comprises a cathode contacting area;
    the first conductive layer is provided within the cathode contacting area, a surface of the first conductive layer is formed with a plurality of recesses, and, the first conductive layer is located in the same layer as but is spaced apart from the anode; and
    the cathode is located in the same layer as and is connected to the second conductive layer.

7. The organic light emitting diode substrate of claim 6, wherein,
    the protrusion is in a strip shape, and a length direction of the protrusion is perpendicular to a printing direction of the ink layer; and
    the recess is in a strip shape and is parallel to the protrusion.

8. The organic light emitting diode substrate of claim 7, wherein,
    the protrusion is provided at a position outside the recess.

9. The organic light emitting diode substrate of claim 1, wherein,
    the ink layer is formed by using a spin coating process; and
    the barrier structure comprises a retaining wall provided outside a side of the exposed area close to the display region.

10. The organic light emitting diode substrate of claim 9, wherein the barrier structure further comprises:
    retaining walls provided outside two lateral sides of the exposed area adjoining the side of the exposed area close to the display region.

11. The organic light emitting diode substrate of claim 10, wherein,
    the retaining wall has a height of 0.5 μm~2.0 μm.

12. The organic light emitting diode substrate of claim 9, further comprising: an organic light emitting diode provided within the display region and comprising an anode, the organic film layer and a cathode; wherein,
    the exposed area comprises a cathode contacting area provided therein with a first conductive layer and a second conductive layer provided above the first conductive layer;
    the first conductive layer provided within the cathode contacting area is located in the same layer as but is spaced apart from the anode, and, a surface of the first conductive layer is formed with a plurality of recesses; and
    the second conductive layer within the cathode contacting area is located in the same layer as and is connected to the cathode.

13. A method for manufacturing the organic light emitting diode substrate of claim 1, the method comprising:
    forming the barrier structure;
    forming the ink layer so that the ink layer does not come into contact with the surface of the exposed area within the border region of the organic light emitting diode substrate.

* * * * *